(12) United States Patent
Pelella et al.

(10) Patent No.: US 7,265,420 B2
(45) Date of Patent: Sep. 4, 2007

(54) SEMICONDUCTOR SUBSTRATE LAYER CONFIGURED FOR INDUCEMENT OF COMPRESSIVE OR EXPANSIVE FORCE

(75) Inventors: Mario M. Pelella, Mountain View, CA (US); Simon S. Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 15 days.

(21) Appl. No.: 11/179,282

(22) Filed: Jul. 12, 2005

(65) Prior Publication Data

US 2005/0263753 A1 Dec. 1, 2005

Related U.S. Application Data

(62) Division of application No. 10/729,479, filed on Dec. 5, 2003, now Pat. No. 7,144,818.

(51) Int. Cl.
*H01L 27/01* (2006.01)
*H01L 27/12* (2006.01)
*H01L 31/0392* (2006.01)

(52) U.S. Cl. ............ 257/347; 257/18; 257/19; 257/E21.17; 257/E21.32; 257/E21.182; 257/E21.545; 257/E21.561

(58) Field of Classification Search ............ 257/18, 257/19, 63, 347, 396, 616, 622, 639, 640, 257/760
See application file for complete search history.

(56) References Cited

U.S. PATENT DOCUMENTS

| 4,597,166 | A | 7/1986 | Iwai |
| 5,294,559 | A | 3/1994 | Malhi |
| 6,191,432 | B1 * | 2/2001 | Sugiyama et al. ............ 257/19 |
| 6,593,191 | B2 | 7/2003 | Fitzgerald |
| 6,677,204 | B2 | 1/2004 | Cleeves et al. |
| 6,707,106 | B1 | 3/2004 | Wristers et al. |
| 6,803,631 | B2 * | 10/2004 | Dakshina-Murthy et al. .... 257/349 |
| 6,835,246 | B2 * | 12/2004 | Zaidi ............ 117/97 |
| 6,900,521 | B2 * | 5/2005 | Forbes et al. ............ 257/616 |
| 7,144,818 | B2 * | 12/2006 | Pelella et al. ............ 438/700 |
| 2002/0046985 | A1 | 4/2002 | Daneman et al. |

FOREIGN PATENT DOCUMENTS

| JP | 61-181931 A | 8/1986 |
| JP | 4-9770 A | 1/1992 |
| JP | 4-245640 A | 9/1992 |
| JP | 5-198783 A | 8/1993 |

OTHER PUBLICATIONS

International Search Report for Application No. PCT/US2004/035417, mailed Apr. 12, 2005, 4 pages.

* cited by examiner

*Primary Examiner*—David Nhu
(74) *Attorney, Agent, or Firm*—Foley & Lardner LLP (57) ABSTRACT

An integrated circuit (IC) utilizes a strained layer. The substrate can utilize trenches in a base layer to induce stress in a layer. The trenches define pillars on a back side of a bulk substrate or base layer of a semiconductor-on-insulator (SOI) wafer.

20 Claims, 7 Drawing Sheets

SEMICONDUCTOR SUBSTRATE LAYER CONFIGURED FOR INDUCEMENT OF COMPRESSIVE OR EXPANSIVE FORCE

CROSS-REFERENCE TO RELATED PATENT APPLICATIONS

This application is a divisional application of U.S. application Ser. No. 10/729,479, filed on Dec. 5, 2003, U.S. Pat. No. 7,144,818B2 the entirety of which is incorporated herein by reference.

FIELD OF THE INVENTION

The present invention is related to integrated circuit (IC) substrates or wafers and to processes of making IC substrates or wafers. More particularly, the present invention relates to a structure for semiconductor substrates and layers.

BACKGROUND OF THE INVENTION

Strained metal oxide semiconductor (SMOS) processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer.

The silicon germanium lattice associated with the silicon germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another.

Relaxed silicon has a conductive band that contains six equal valence bands. The application of tensile strain to the silicon causes four of the valence bands to increase in energy and two of the valence bands to decrease in energy. As a result of quantum effects, electrons effectively weigh 30 percent less when passing through the lower energy bands. Thus, the lower energy bands offer less resistance to electron flow. In addition, electrons meet with less vibrational energy from the nucleus of the silicon atom, which causes them to scatter at a rate of 500 to 1000 times less than in relaxed silicon. As a result, carrier mobility is dramatically increased in strained silicon compared to relaxed silicon, providing an increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

Conventional SOI substrates have included a strained silicon layer above a buried oxide layer above a base layer. The buried oxide layer can be formed in a variety of processes including deposition above the base layer or by doping the base layer with oxygen. The strained semiconductor layer can be formed by providing a silicon germanium layer having a composition of $Si_{(1-x)}Ge_x$, where x is approximately 0.2, and is more generally in the range of 0.1-0.3. The silicon germanium layer can be deposited by chemical vapor deposition using silane and germane. The concentration of germane can be decreased as deposition occurs so that the upper most part of the silicon germanium layer is mostly or all silicon.

The use of germanium in SMOS processes can cause germanium contamination problems for IC structures, layers, and equipment. In particular, germanium outgassing or outdiffusion can contaminate various components associated with the fabrication equipment and integrated circuit structures associating with the processed wafer. Further, germanium outgassing can negatively impact the formation of thin films. In addition, germanium outdiffusion can cause germanium accumulation or "pile-up" at the interface of the liner, thereby causing reliability issues for the STI structure.

Germanium outgassing can be particularly problematic at the very high temperatures and HCl ambient environments associated with the liner of a shallow trench isolation (STI) structure. For example, conventional STI liner oxide processes can utilize temperatures of approximately 1000° C. which enhance germanium outgassing.

Thus, there is a need for a strained semiconductor substrate which can be formed without using germanium. Further still, there is a need for a process of forming high quality SMOS substrates. Further still, there is a need for an SMOS wafer formation process that does not require strained layer deposition. Yet further, there is a need for a substrate that is not as susceptible to germanium outgassing. Further still, there is a need for new process of forming strained semiconductor layers. Even further, there is a need for a wafer process that enhances and/or increases the longevity of the strained characteristic of a layer.

SUMMARY OF THE INVENTION

An exemplary embodiment relates to a method of manufacturing an integrated circuit substrate. The integrated circuit substrate includes a strained layer. The method includes providing a base layer, providing an insulating layer above the base layer, and providing a semiconductor layer above the insulating layer. The method further includes forming pillars in the base layer.

Another exemplary embodiment relates to a method of forming a strained semiconductor layer above a base layer. The method includes etching trenches in the base layer and providing a compressive material in the trenches.

Still another exemplary embodiment relates to a substrate. The substrate includes a strained layer and a base layer below the strained layer. The base layer has trenches on a side opposite the strained layer. The trenches induce stress in the strained layer.

BRIEF DESCRIPTION OF THE DRAWINGS

Exemplary embodiments will become more fully understood from the following detailed description, taken in conjunction with the accompanying drawings, wherein like reference numerals refer to like parts, and wherein.

DETAILED DESCRIPTION OF PREFERRED EXEMPLARY EMBODIMENTS

FIGS. 1-8 illustrate substrates and processes for providing a strained semiconductor layer, such as a strained silicon layer. The structures and processes can be utilized without requiring germanium doping or be utilized in conjunction with germanium doping.

Figure 1:
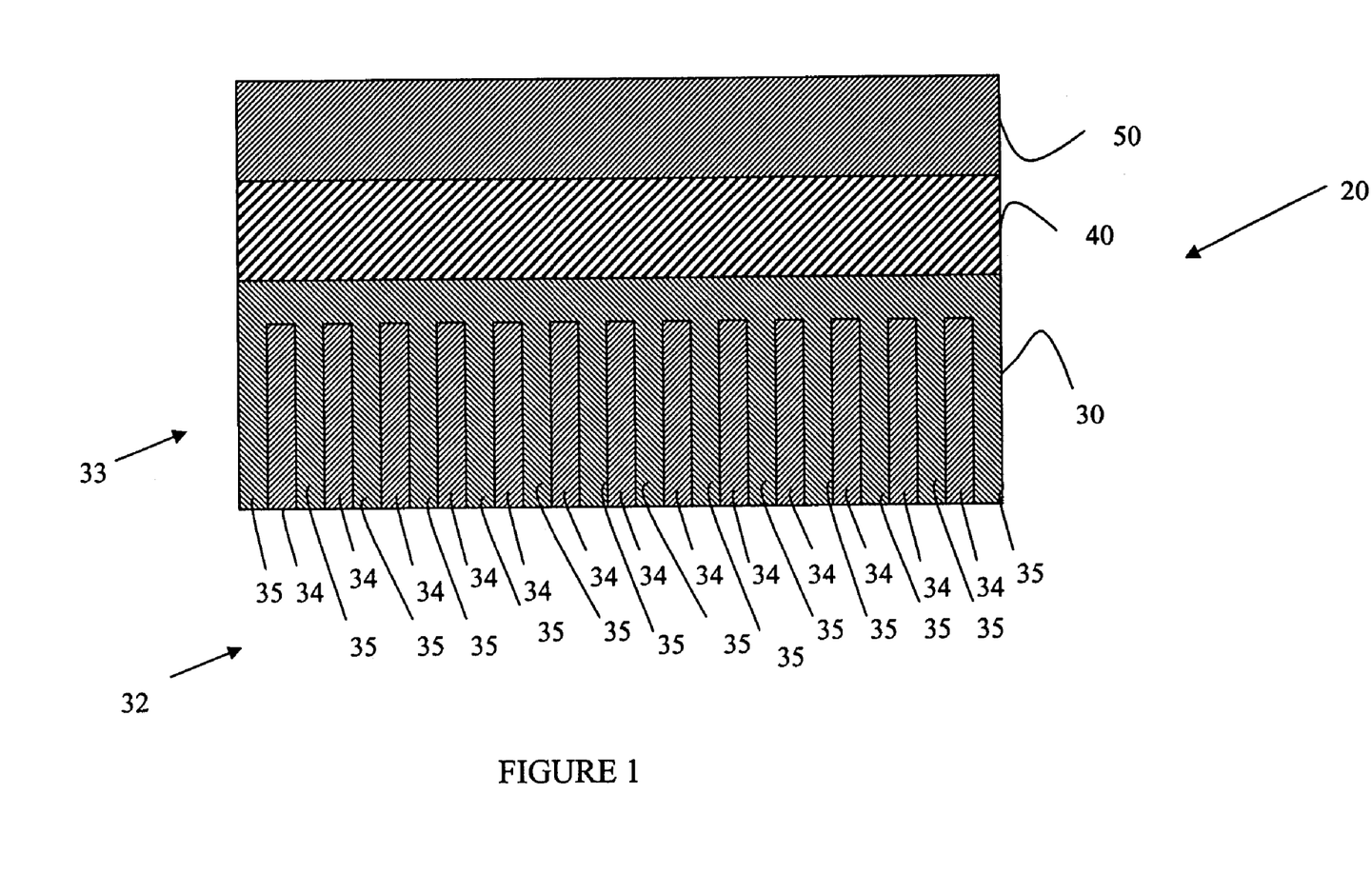
FIG. 1 is a cross-sectional view schematic drawing of a portion of a substrate including a strained semiconductor layer, an oxide layer and a base layer in accordance with an exemplary embodiment.

Referring to FIG. 1, a portion 20 of an integrated circuit (IC) can be part of a wafer or substrate, such as a semiconductor-on-insulator (SOI) substrate. Portion 20 can be formed in a process 100 (FIG. 7) and is preferably for use in a strained metal oxide semiconductor (SMOS) application.

Portion 20 includes a substrate comprised of a strained layer 50, a buried oxide layer 40, and a base layer 30. Layer 50 can include germanium or be provided over a layer including germanium. In addition, a support substrate can be provided beneath layer 30.

In one embodiment, base layer 30 is a single crystalline silicon layer. Layer 30 can be 400-1000 microns thick. Buried oxide layer 40 can be a silicon dioxide layer. Layer 40 can be 500-2000 Å thick. Strained layer 50 is preferably silicon or silicon/germanium (10 to 30% germanium). Layer 50 can be approximately 500 Å thick.

Layer 50 is preferably under tensile stress due to a set 32 of trenches 36 (FIG. 2) including a compressive material 34. In one embodiment, set 32 of trenches 36 can be empty and the absence of material associated with the trenches causes tensile stress less in layer 50. Preferably, set 32 of trenches 36 are filled with compressive material 34 such as a plasma enhanced chemical vapor deposition (PECVD) silicon nitride (SiN) material, a metal, or other material which becomes compressed upon or after depositing in set 32 of trenches 36. If tensile stress is desired in trenches 36, a thermally-formed silicon nitride (SiN) material or low pressure chemical vapor deposition (LPCVD) SiN material can be utilized instead of plasma enhanced chemical vapor deposition (PECVD) SiN which causes compressive stress.

The compressive stress on layer 30 is transferred through layer 40 to layer 50 as a tensile stress. Compressing layer 30 of portion 20 stretches layers 40 and 50. In an alternative embodiment, layer 40 is not present and layer 50 is directly above layer 30. In yet another embodiment, layer 30 can operate as a bulk substrate wherein a top surface is used for the active region. The top surface is under tensile stress due to the compressed strain at the bottom surface associated with set 32 of trenches 36.

In one embodiment, set 32 of trenches 36 correspond to the size of active regions in layer 50. In one embodiment, the same mask used to define active regions above layer 50 can be used to define set 32 of trenches 36. Some trenches 36 can be larger than other trenches. For example, small trenches at certain locations may be necessary to maintain the integrity of the entire wafer.

Compressive material 34 preferably extends approximately 700 angstroms from a bottom surface of layer 30 towards layer 40. In one embodiment, set 32 of trenches 36 extend all the way to layer 40 (e.g., trenches 36 reach bottom surface of layer 40). In another embodiment, trenches 36 extend to a distance 75% of the depth of layer 30. Preferably, trenches 36 are 500-700 microns deep. Preferably, layer 40, layer 50 and layer 30 are present on portion 20 before set 32 of trenches 36 is formed.

Preferably, trenches 36 have a width of from 500-2000 angstroms and a length of several microns. Set 32 of trenches 36 can have a tapered shape. For example, trenches 36 can have a trapezoidal cross-sectional shape with the narrower portion being closer to layer 40. If set 33 of pillars 35 are disposed between trenches 32, pillars 35 can be preferably have a width slightly larger than the width of trenches 36. The length of pillars 35 can also be slightly longer or the same as the length of trenches 36.

Figure 2:
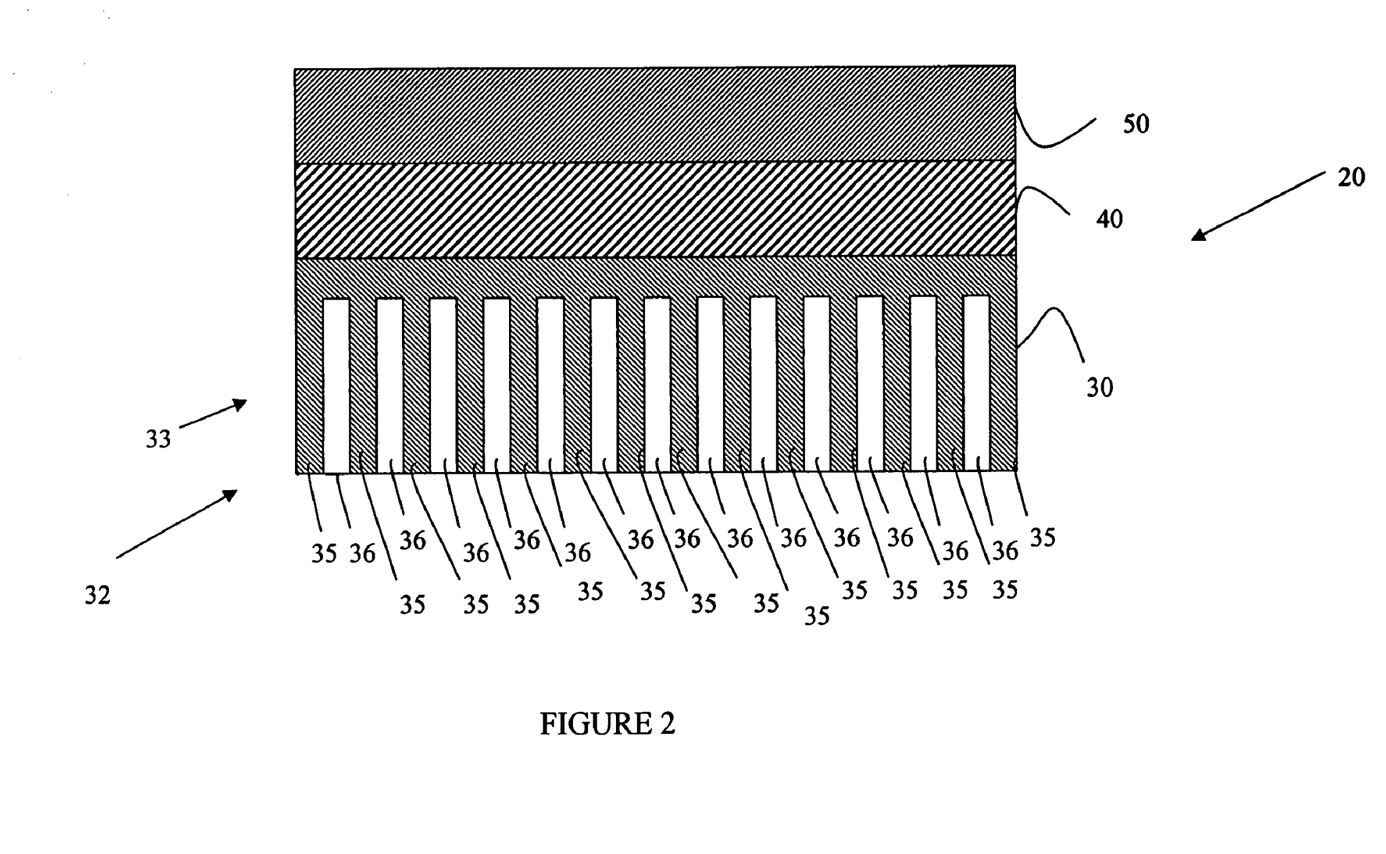
FIG. 2 is a cross-sectional view of the portion illustrated in FIG. 1, showing an etching step.

With reference to FIG. 7 and FIGS. 1-3, the formation of portion 20 is described as follows. In FIG. 2, set 32 of trenches 36 are etched in a photolithographic process. A pad oxide layer and silicon nitride hard mask can be used to form trenches 36.

An active layer photolithographic mask can be utilized to define trenches 36. The regions of the active layer photolithographic mask corresponding to the isolation trench on layer 50 correspond to the position of trenches 36 on the back side of the IC wafer.

Trenches 36 are preferably etched in a dry etching process selective to layer 30 (e.g., silicon) with respect to the material of layer 40 (e.g., silicon dioxide). Set 32 of trenches 36 are etched in a backside of layer 30 of the IC wafer. The etching process can be a timed etching process to determine the depth of trenches 36. Alternatively, the etching process can reach layer 40 and stop at layer 40. Alternative trench formation processes can be utilized to form trenches 36.

Formation of set 32 of trenches 36 leaves set 33 of pillars 35 in layer 30. Pillars 35 are formed after layers 50 and 40 are disposed above layer 30. Pillars 35 are preferably the same material as layer 30 (e.g. silicon).

Figure 3:
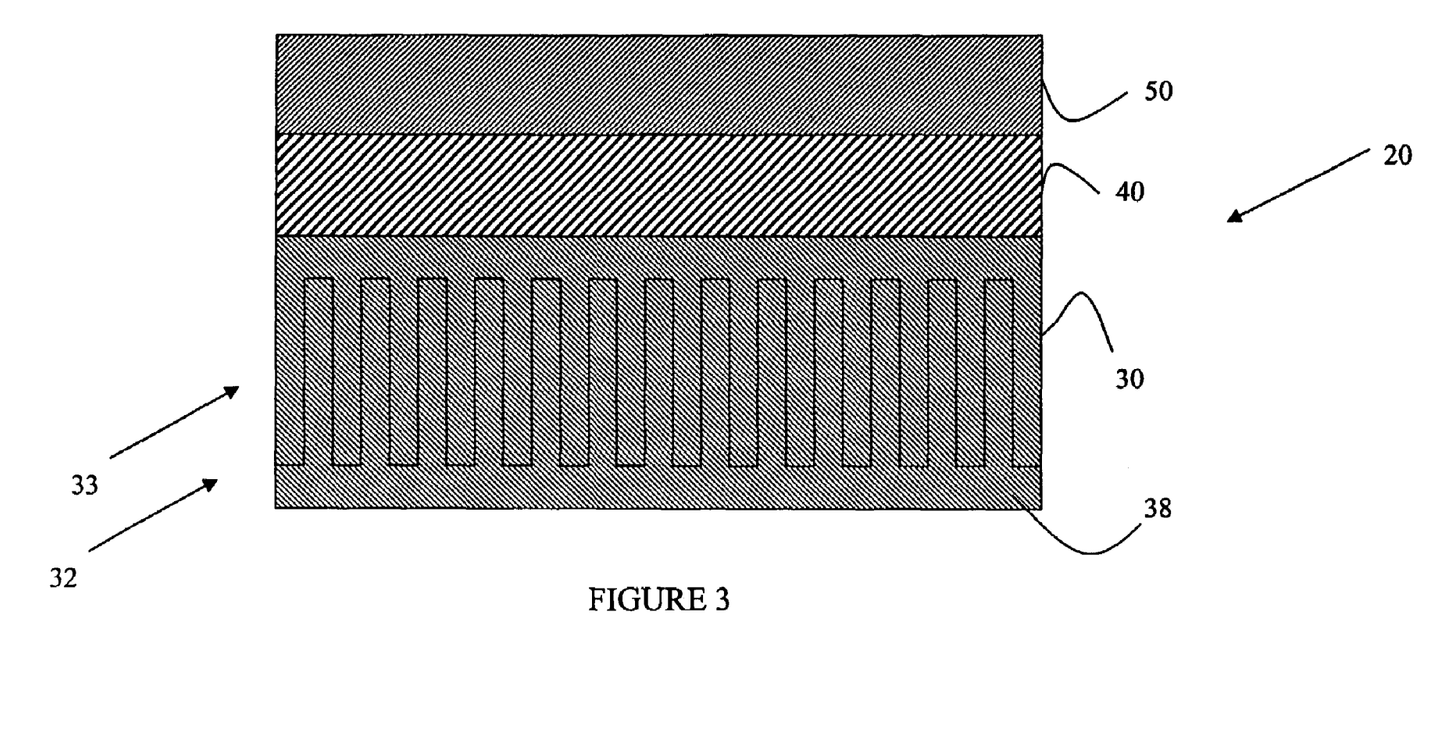
FIG. 3 is a cross-sectional view of the portion illustrated in FIG. 2, showing a deposition step.
Figure 7:
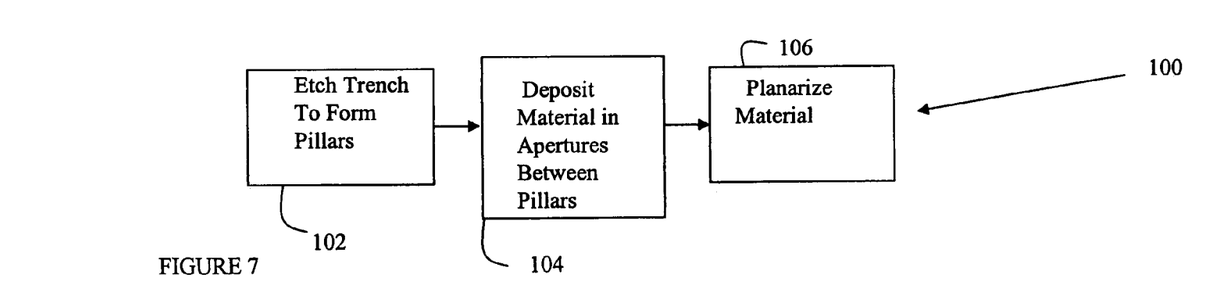
FIG. 7 is a general flow diagram showing a process for fabricating the portion illustrated in FIG. 1.

With reference to FIG. 3, compressive material 38 fills trenches 36 (FIG. 2) in a step 104 of process 100. Preferably, a compressive material, such as a compressive material including silicon nitride fills trenches 36 and then shrinks to pull pillars 35 associated with trenches 36 towards each other. The compressive material creates a compressive strain in layer 40 which provides a tensile strain on layers 40 and 50 above it.

Material 38 can be a compressive metal or a nitride material. In one embodiment, material 38 is PECVD silicon nitride.

Material 38 can be deposited in a conformal layer deposition process such as by plasma enhanced chemical vapor deposition or sputter deposition. Material 38 preferably has a thickness greater than or equal to one half the width associates with trenches 36 or 250-1000 Angstroms (Å) or more thick in a preferred embodiment Angstroms thick. For SiN, the deposition parameters of material 38 can be Silane (SiH4)+Ammonia (NH3)+Nitrogen (N2) using a pressure of 10-1000 MilliTorr, an rf power of 10-1000 W, and a temperature of 100-500° C. Preferably, material 38 naturally compresses after deposition.

With reference to FIG. 1, material 38 (FIG. 3) is planarized in a step 106 of process 100 to leave material 34 between set 33 of pillars 35 associated with set 32 of trenches 36. Material 38 can be planarized in a chemical mechanical polishing process or other etching process.

Figure 4:
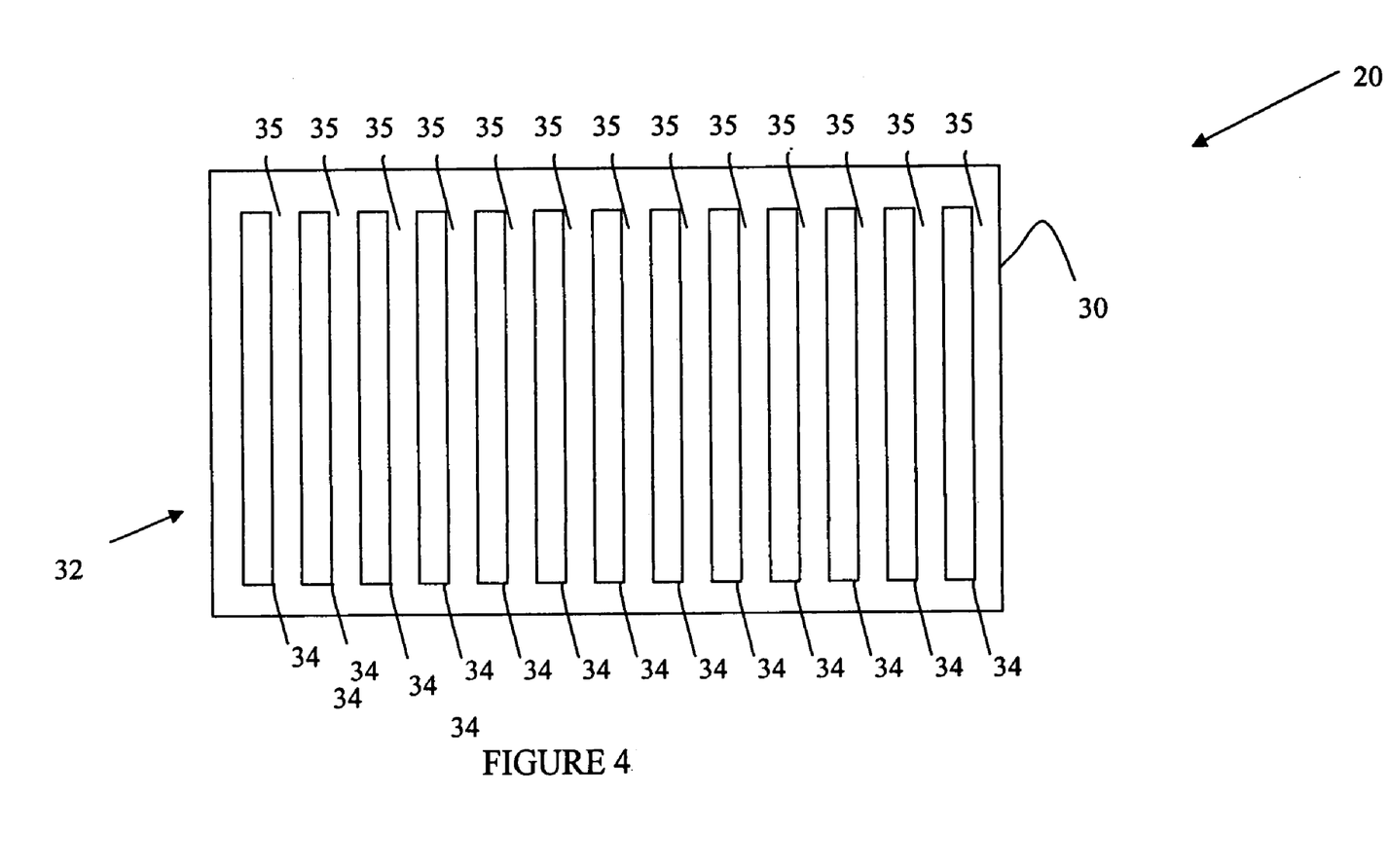
FIG. 4 is a bottom view of the portion illustrated in FIG. 1.
Figure 5:
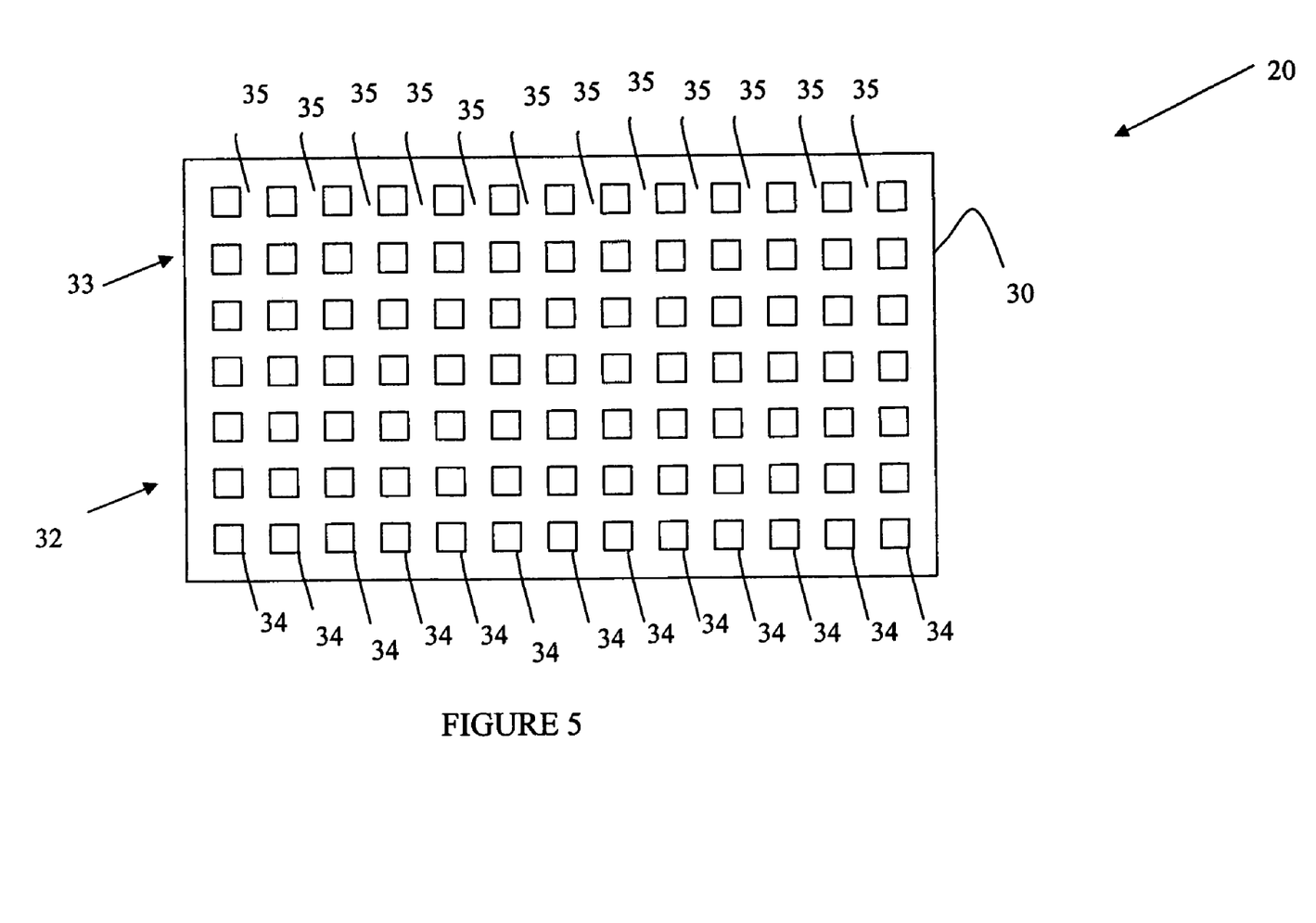
FIG. 5 is a bottom view schematic drawing of another portion of a substrate in accordance with another embodiment.
Figure 6:
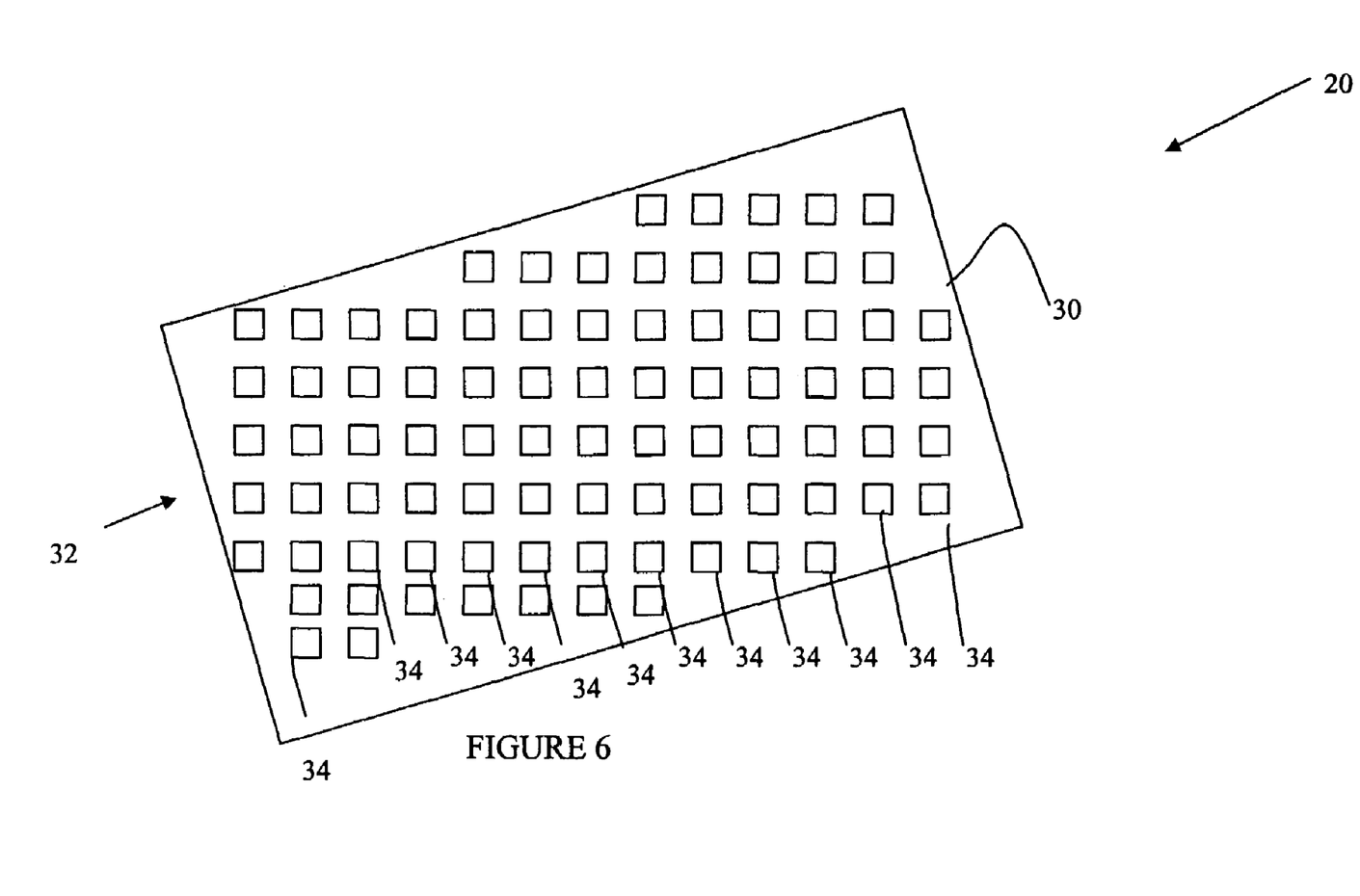
FIG. 6 is a bottom view schematic drawing of yet another portion of a substrate in accordance with another embodiment.

With reference to FIG. 4, set 32 of trenches 36 can have a rectangular shape. In accordance with another embodiment in FIG. 5, trenches 36 including material 34 have a square shape or a rectangular shape with an aspect ratio relatively close to one. In another embodiment, the pattern of material 34 is provided at an angle with respect to the lateral and top sides of layer 30 shown in FIG. 6.

In one embodiment, set of trenches 36 including material 34 are provided in a waffle pattern. As discussed above with reference to FIG. 1, set 32 of trenches 36 can include trenches of various sizes. Some trenches and pillars in layer 30 can be smaller or larger than others depending upon design criteria. For example, an IC wafer may be required to be stronger at certain portions and have smaller trenches in particular regions for integrity. Further, the patterns shown in FIGS. 4-6 can be reversed with the locations for trenches 36 (material 34) being switched with the locations for pillars 35.

Figure 8:
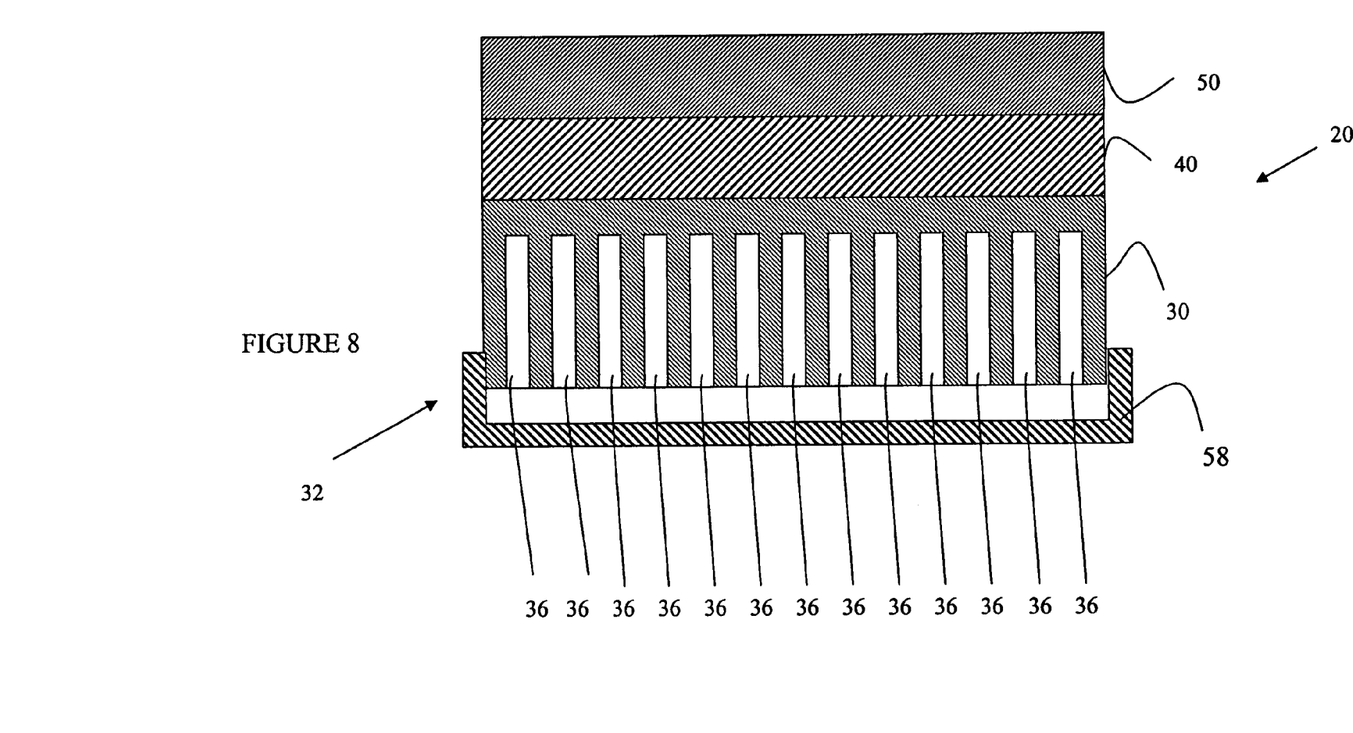
FIG. 8 is a cross-sectional view of the portion illustrated in FIG. 1, showing a mechanical compression system attached to the substrate.

With reference to FIG. 8, portion 20 is provided with a mechanical system for additional compressive stress. In this embodiment, trenches 36 can be emptied or filled with material 34. System 58 can be a spring or clip. In one embodiment, system 58 is provided as part of an IC package utilized to house portion 20.

In another embodiment, material 38 can be a low thermal resistance material to increase heat flow from portion 20. Low thermal resistance materials include silicon and/or metal.

It is understood that while the detailed drawings, specific examples, and particular values given provide a preferred exemplary embodiment of the present invention, it is for the purpose of illustration only. The patterns, shapes and sizes of trenches and pillars are not disclosed in a limiting fashion. The method and apparatus of the invention is not limited to the precise details and conditions disclosed. Various changes may be made to the details disclosed without departing from the spirit of the invention, which is defined by the following claims.

What is claimed is:

1. A substrate comprising:
   a strained layer having a relatively planar top surface and a relatively planar bottom surface; and
   a base layer below the relatively planar bottom surface of the strained layer, the base layer having trenches on a side opposite the strained layer, the trenches inducing stress in the strained layer.

2. The substrate of claim 1, wherein the strained layer is a strained silicon.

3. The substrate of claim 1, further comprising a compressive material in the trenches.

4. The substrate of claim 1, further comprising a buried oxide layer between the base layer and the strained layer.

5. An IC substrate comprising:
   a strained semiconductor layer having a relatively parallel top and bottom surfaces; and
   a base layer, the base layer including a plurality of trenches and a compressive material disposed in the trenches, the trenches being formed on a second side of the base layer opposite a first side of the base layer, the second side being farther from the strained semiconductor layer than the first side.

6. The substrate of claim 5, further comprising a liner in the trenches.

7. The substrate of claim 6 further comprising a mechanical compressive force on the base layer.

8. The substrate of claim 5, wherein the trenches are in a waffle pattern.

9. The substrate of claim 5, wherein the compressive material is a low thermal resistance material.

10. The substrate of claim 5, wherein the compressive material includes nitride.

11. The substrate of claim 5, wherein a buried oxide layer is between the base layer and the strained semiconductor layer.

12. The substrate of claim 5, wherein the semiconductor layer is silicon.

13. A substrate for an integrated circuit including a strained layer, comprising:
   a base layer;
   an insulating layer above the base layer;
   a semiconductor layer above the insulating layer, the semiconductor layer having a relatively planar bottom surface and a relatively planar top surface, the relatively planar top surface being for formation of active devices; and
   a plurality of pillars in the base layer, the pillars being formed on a first side of the base layer opposite from a second side of the base layer, the second side being closer to the bottom surface than the first side.

14. The substrate of claim 13, wherein the base layer includes a compressive material in apertures associated with the pillars.

15. The substrate of claim 14, wherein the compressive material is planarized until the base layer is reached.

16. The substrate of claim 13, wherein the semiconductor layer includes silicon.

17. The substrate of claim 13, wherein the insulative layer includes silicon dioxide.

18. The substrate of claim 13, wherein the base layer includes silicon.

19. The substrate of claim 13, wherein the pillars have a width of 2000-3000 Å.

20. The substrate of claim 13, wherein the compressive material includes nitride.

* * * * *